(12) United States Patent
Fort

(10) Patent No.: US 7,642,815 B2
(45) Date of Patent: Jan. 5, 2010

(54) SENSE AMPLIFIER

(75) Inventor: Jimmy Fort, Provence (FR)

(73) Assignee: Atmel Corporation, San Jose, CA (US)

( * ) Notice: Subject to any disclaimer, the term of this patent is extended or adjusted under 35 U.S.C. 154(b) by 0 days.

(21) Appl. No.: 11/855,565

(22) Filed: Sep. 14, 2007

(65) Prior Publication Data

US 2009/0073781 A1 Mar. 19, 2009

(51) Int. Cl.
*G11C 7/06* (2006.01)
(52) U.S. Cl. .................. 327/51; 365/189.15
(58) Field of Classification Search ........... 365/185.21, 365/185.2, 195.25, 185.25; 327/51, 333
See application file for complete search history.

(56) References Cited

U.S. PATENT DOCUMENTS

| | | | |
|---|---|---|---|
| 4,785,259 A | 11/1988 | Seelbach et al. | |
| 4,918,341 A | 4/1990 | Galbraith et al. | |
| 5,013,943 A | 5/1991 | Hirose | |
| 5,023,841 A | 6/1991 | Akrout et al. | |
| 5,493,533 A | 2/1996 | Lambrache | |
| 5,646,900 A | 7/1997 | Tsukude et al. | |
| 5,666,310 A | 9/1997 | Yu et al. | |
| 5,850,359 A | 12/1998 | Liu | |
| 5,886,934 A | 3/1999 | Nagaoka et al. | |
| 5,892,260 A | 4/1999 | Okumura et al. | |
| 6,049,496 A | 4/2000 | Forbes et al. | |
| 6,091,654 A | 7/2000 | Forbes et al. | |
| 6,094,394 A * | 7/2000 | La Rosa | 365/207 |
| 6,104,066 A | 8/2000 | Noble et al. | |
| 6,235,569 B1 | 5/2001 | Noble et al. | |
| 6,349,060 B1 | 2/2002 | Ogura et al. | |
| 6,451,656 B1 | 9/2002 | Yu et al. | |
| 6,466,059 B1 * | 10/2002 | Gaibotti et al. | 327/53 |
| 6,473,356 B1 | 10/2002 | Raszka | |
| 6,608,787 B1 | 8/2003 | Daga et al. | |
| 6,707,717 B2 * | 3/2004 | Jun-Lin | 365/185.21 |
| 7,092,278 B2 | 8/2006 | Ishida et al. | |
| 7,221,605 B2 | 5/2007 | Forbes | |
| 7,304,903 B2 | 12/2007 | Mukhopadhyay et al. | |
| 2008/0192555 A1 | 8/2008 | Fort | |

FOREIGN PATENT DOCUMENTS

| | | |
|---|---|---|
| JP | 2001-319488 | 11/2001 |
| WO | WO 2008100428 A1 | 8/2008 |

OTHER PUBLICATIONS

"U.S. Appl. No. 11/673,105 Notice of Allowance mailed Feb. 6, 2009", 12 pgs.
"International Application Serial No. PCT/US2008/001696, International Search Report mailed Jun. 16, 2008", 3 pgs.
"International Application Serial No. PCT/US2008/001696, Written Opinion mailed Jun. 16, 2008", 6 pgs.
"U.S. Appl. No. 11/673,105, Notice of Allowance mailed Apr. 3, 2009", 7 pgs.
"U.S. Appl. No. 11/673,105, Notice of Allowance mailed Aug. 5, 2009", 5 pgs.

* cited by examiner

*Primary Examiner*—Dinh T. Le
(74) *Attorney, Agent, or Firm*—Schwegman, Lundberg & Woessner P.A.

(57) ABSTRACT

A single ended sense amplifier circuit is disclosed that is operable to measure a state of a memory cell. The amplifier can track and compensate for variations in cell current via feedback to maintain precision. The amplifier can be used with low supply voltages while still providing high-speed operation.

26 Claims, 1 Drawing Sheet

SENSE AMPLIFIER

TECHNICAL FIELD

This invention relates to electrical circuits.

BACKGROUND

Some memory structures (e.g., dynamic random access memory (DRAM), electrically erasable programmable read-only memory (EEPROM), flash memory, etc.) are commonly arranged in arrays of memory cells. During a read operation, one or more of the memory cells are selected and activated. For example, the selected memory cells are enabled and are electronically connected to sense amplifiers, which can distinguish signals from the memory cell that represent a stored 0 or 1. The sense amplifier can then provide the sensed value to an output.

A sense amplifier can also precharge a bitline to a proper voltage level in a read operation. After the precharge operation, the sense amplifier uses the precharge voltage to sense a selected memory cell current flowing through the bitline. For example, the sense amplifier can compare the memory cell current with a current threshold. If the memory cell current is greater than the current threshold, then the stored bit can be, for example, a logic 0. If the memory cell current is less than the current threshold, then the stored bit can be, for example, a logic 1.

Some sense amplifiers have a current threshold ($Icell_{th}$) that is uncorrelated with the operational characteristics of a selected memory cell. A mismatch between $Icell_{th}$ and a memory cell current can degrade the precision of a sense amplifier.

SUMMARY

This specification describes technologies relating to sense amplifiers.

In general, one aspect of the subject matter described in this specification can be embodied in an amplifier apparatus including a bias circuit, a transimpedance amplifier, and a feedback circuit. The circuit design can be used with low supply voltages, for example, voltages lower than 1.2 V. The apparatus is operable to read a memory cell and output a voltage representative of a state of the memory cell. In operation, the circuit charges a bitline node that can be connected to a memory cell, and monitors current flow through that node to read a state of the memory cell. The transimpedance amplifier provides a voltage proportional to the measured current. An output stage can amplify the voltage output of the transimpedance amplifier and provide a logical representation of the state of the memory cell. The feedback circuit can monitor the voltage output of the transimpedance amplifier and compensate for variations in current to maintain precision of the circuit output by injecting current into the bitline node.

Other embodiments are disclosed.

DESCRIPTION OF DRAWINGS

Like reference symbols in the various drawings indicate like elements.

DETAILED DESCRIPTION

Figure 1:
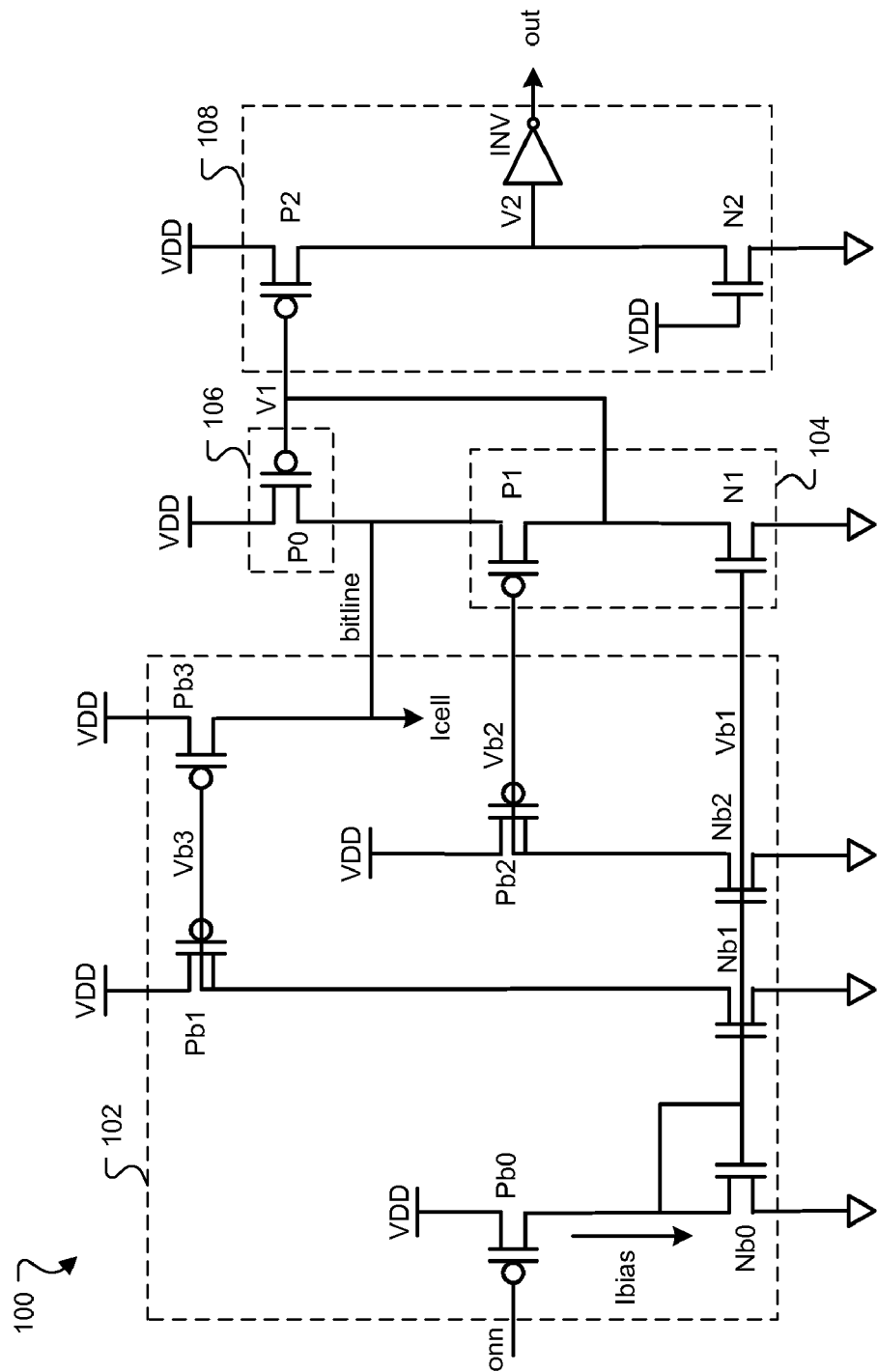
FIG. 1 is a schematic diagram of an example sense amplifier circuit.

FIG. 1 shows an example sense amplifier circuit 100 that can precharge a bitline node at a stable value and sense a memory cell current (Icell) of a selected memory cell. The circuit 100 includes a bias circuit 102, a transimpedance amplifier 104, a feedback circuit 106, and an output stage 108. In an implementation, the sense amplifier circuit 100 generates an output by comparing Icell with a current threshold. Icell generated by a memory cell can vary due to temperature, supply voltage, and manufacturing processes used in constructing the components. The sense amplifier circuit 100 can improve measurement precision of the sensing operation by tracking variations in the output stage 108.

The bias circuit 102 includes p-channel metal-oxide-semiconductor (PMOS) field-effect transistors Pb0, Pb1, Pb2, and Pb3. The bias circuit 102 also includes n-channel metal-oxide-semiconductor (NMOS) field-effect transistors Nb0, Nb1, and Nb2. As shown, Pb0 is coupled to a node, "onn," of an external device (e.g., a memory controller). A voltage applied at node onn can enable and disable the sense amplifier circuit 100. For example, if the onn node is set to a high voltage (e.g., VDD), then N2 sets the output voltage at the node out to a high voltage and no DC current flows in the circuit 100. If onn is set to a low voltage (e.g., substantially close to 0 V), then the circuit 100 starts precharging at the node bitline and current flows through P0 and Pb3. Pb0 and Nb0 can generate a bias current, Ibias, if the circuit 100 is enabled.

In an implementation, Pb1 and Pb2 generate biasing voltages at Vb3 and Vb2, respectively. In this example, Pb0 and Nb0 can generate biasing current for the circuit 100. The circuit 100 can also be constructed using other solid state circuit elements or device configurations that take into account fundamental thermal characteristics of voltage or current generation of the electronic components in the bias circuit 102. For example, the bias circuit 102 can include elements or configurations having proportional to absolute temperature (PTAT) characteristics. In another example, the bias circuit 102 can include elements or configurations having complementary to absolute temperature (CTAT) characteristics.

The transistors Nb0, Nb1, Nb2, and N1 are current mirrors of Ibias. For example, the bias circuit 102 can generate a biasing current for the transimpedance amplifier 104 by setting the biasing current at N1. The transimpedance amplifier 104 can convert a current variation of Icell into a voltage variation at an output node V1. In one example, the transimpedance amplifier 104 can generate the output voltage with a gain equivalent to a drain to source resistance of N1 ($rds_{N1}$). The transimpedance amplifier 104 includes a PMOS transistor P1 and a NMOS transistor N1. In the depicted example, P1 and N1 are coupled in series between the bitline node and ground. In some implementations, the transimpedance amplifier 104 receives current from the bitline node. Based on the received current, the transimpedance amplifier 104 generates an output voltage at V1. In some examples, the variation of the output voltage at V1 is related to (e.g., proportional to) the variation of the input current at the bitline node.

The output voltage at V1 is coupled to the feedback circuit 106 and the output stage 108. The feedback circuit 106 includes a PMOS transistor P0. The feedback circuit 106 can be a voltage-current feedback that can convert voltage variations at V1 into a variation of drain to source current of P0 ($I_{P0}$) with a feedback gain. For example, the feedback gain may be substantially equal to the transconductance of P0 ($gm_{P0}$). The output stage 108 amplifies voltage variations at V1. The output stage 108 includes a pullup PMOS transistor P2, a pulldown NMOS transistor N2, and an inverter INV. As shown, a gate terminal of N2 is connected at VDD so that N2 is biased in the triode region. Biasing N2 in the triode region can enable N2 to correlate memory cell current variations due to temperature, supply voltage, and manufacturing processes.

In implementations, the output stage 108 amplifies V1 into V2 and generates an output voltage at the node out. INV can generate a voltage based on a comparison between a voltage at V2 and an inverter threshold voltage (Vth$_{INV}$). For example, INV can generate a voltage substantially close to 0 V at the node out if V2>Vth$_{INV}$ and INV can generate a voltage substantially close to VDD at the node out if V2<Vth$_{INV}$.

In operation, the circuit 100 receives electrical power from various supply voltage nodes. Depending on the implementation, the supply voltage, VDD, can be less than 1.5 V or less than 1.2 V. The circuit 100 can precharge the bitline node to a clamped precharge voltage and sense Icell to determine whether a selected memory cell is enabled. For example, the circuit 100 can precharge a voltage at the bitline ($V_{bitline}$) close to VDD (e.g., VDD−Vds$_p$, where Vds$_p$ is drain to source voltage of Pb3 or P0). As an illustrative example, suppose $V_{bitline}$ is lower than the clamped value. If $V_{bitline}$=0 V, then the transimpedance amplifier 104 outputs 0 V at V1. In this example, P1 is Off if $V_{bitline}$=0 V and voltage at V1 is set to 0 V by N1. A precharge current flows through P0 ($I_{P0}$) to precharge a bitline capacitor (not shown). A current through Pb3 ($I_{Pb3}$) also contributes to precharging the bitline with a current Ibias. In some examples, $I_{P0}$ is directly related to a source to gate voltage of P1 (Vsg$_{P1}$). For example, $I_{P0}$ may be decreased when Vsg$_{P1}$ is decreased. $V_{bitline}$ increases when the precharge current flows.

In the depicted example, P1 is turned on when Vsg$_{P1}$ is greater than a voltage threshold (Vt$_{P1}$). After P1 is turned on, the transimpedance amplifier 104 can increase the output voltage at V1. As the voltage at V1 increases, the source to gate voltage of P0 (Vsg$_{P0}$) decreases. Thus, the precharge current $I_{P0}$ also decreases. P0 is turned off if Vsg$_{P0}$ is below a voltage threshold. If P0 is turned off, $I_{P0}$ is substantially zero and $V_{bitline}$ stops increasing.

In some examples, if Icell=0, then $I_{P1}$, and $I_{N1}$ may be approximately equal to $I_{Pb3}$. As discussed above, Nb0, Nb1, Nb2, and N1 are current mirrors of Ibias, so $I_{P1}$, may be approximately equal to Ibias. In the depicted example, the clamped bitline voltage depends on factors including a size of P1 and the voltage at Vb2. A maximum voltage at the bitline node can be VDD minus the saturated drain-source voltage of the transistors Pb3 and P0 ($V_{ds,sat}$).

In some implementations, the clamped bitline voltage may be related to a polarization of a loop formed by P1, N1, and P0. For example, the precharge current stops when $I_{Pb3}$=$I_{P1}$=$I_{N1}$=Ibias. In some examples, the equity occurs when P0, P1, and N1 are in saturation region. For example, $$I_{P1} = Ibias = \frac{K_P}{2}\left|\frac{W}{L}\right|_{P1}(V_{bitline} - Vb2 - |Vt_{P1}|)^2,$$

where K$_p$ is a p-type device manufacturing process gain factor, W is a width, and L is the length of the device P1. By solving the above equation, the clamped bitline voltage can be expressed as:

$$V_{bitline} = \sqrt{\frac{2 \cdot Ibias}{K_P \cdot \left|\frac{W}{L}\right|_{P1}}} + Vb2 + |Vt_{P1}|$$

In this example, Ibias and Vb2 are maintained by the bias circuit 102. In some implementations, Pb3 is operating at saturation when the precharge operation stops. Such a condition can be described by:

$$V_{bitline} = VDD - |Vds_{sat}|_{Pb3} \text{ and}$$

$$V_{bitline} - VDD \geq VDD - Vb3 - |Vt_{Pb3}|$$

By solving the above equations for $V_{bitline}$, a relationship between $V_{bitline}$, Vb3 and $Vt_{Pb3}$ can be expressed as:

$$V_{bitline} \leq Vb3 + |Vt_{Pb3}|, \text{ with } Vb3 = VDD - \sqrt{\frac{2 \cdot Ibias}{K_P \cdot \left|\frac{W}{L}\right|_{P1}}} + |Vt_{P1}|$$

As shown in the above equations, the clamped precharge voltage $V_{bitline}$ depends on a size of Pb3, Ibias, and voltages at Vb2 and Vb3. The clamped precharge voltage can be produced at a voltage level within one transistor voltage drop of the supply voltage VDD. For example, the sense amplifier circuit 100 can precharge the bitline voltage to a voltage close to (VDD−100 mV). Because the clamped bitline voltage is close to VDD, the circuit 100 can be used in low supply voltage applications.

The circuit 100 can be coupled to one or more memory cells. A controller or a microprocessor can, for example, activate one of the memory cells to perform a memory read operation. During a read operation Icell flows from the circuit 100 to the selected memory cell. Based on Icell, the circuit 100 can sense a state of the selected memory cell to determine whether the memory cell is on or off.

In one example, Icell=0 A if the memory cell is off. In this case, the current flow through P0 ($I_{P0}$) is substantially zero because, $$I_{Pb3} = I_{P1} = I_{N1} = Ibias \text{ and}$$

$$Icell = 0 = I_{Pb3} + I_{P0} - I_{P1}.$$

If P0 is off, then P2 is off. Therefore, no current flows through P2 if Icell=0 A. Consequently, the node V2 is set to 0 V by N2. As a result, INV sets the node out to VDD.

In one example, Icell≠0 A if the memory cell is on. In this case, the current $I_{P0}$ is set to Icell due to the negative voltage current feedback circuit 106. Depending on the sizing ratio between P0 and P2, $I_{P2}$ is set to n* Icell. Consequently, voltage at V2 increases. INV sets the node out to 0 V when V2>Vth$_{INV}$.

In implementations, the current trip point (Icell$_{th}$) depends on the sizes of P2 and N2, and VDD. In one example, the current trip point occurs when, $$V2 = I_{P2} \cdot R_{eq,N2} = n \cdot I_{P0} \cdot R_{eq,N2} = n \cdot Icell_{th} \cdot R_{eq,N2} = V_{th,INV},$$

where n is the sizing ratio between P0 and P2 given by:

$$n = \frac{\left|\frac{W}{L}\right|_{P2}}{\left|\frac{W}{L}\right|_{P0}},$$

and R$_{eq,N2}$ is the equivalent resistance of N2 in the triode region given by:

$$R_{eq,N2} = \frac{1}{K_P \cdot \left|\frac{W}{L}\right|_{N2} \cdot (VDD - Vt_{N2})}$$

Using the above equations, a relationship of $Icell_{th}$ can be expressed as:

$$Icell_{th} = \frac{1}{n} \cdot K_P \cdot \left|\frac{W}{L}\right|_{N2} \cdot (VDD - Vt_{N2}) \cdot V_{th,INV}$$

As shown, $Icell_{th}$ can be determined based on the sizing ratio of P0 and P2, the size of N2, and a value of VDD.

During a read operation, the selected memory cell may be operating in a state equivalent to a transistor in the triode region. Because N2 of the output stage 108 is operating in the triode region, variations in operation characteristics of the memory cell are correlated to the variations in operation characteristics of N2. Using N2 to track the characteristics variations, $Icell_{th}$ of the circuit 100 varies to improve measurement precision of the memory cell current Icell.

The circuit 100 can perform current sensing operation in high speed by doing the current voltage conversion at V1. For example, V1 may have a lower capacitance than the capacitance at the bitline node. The feedback circuit 106 can increase a frequency bandwidth of the node V1 by the gain of $1+gm_{P0} \cdot rds_{N1}$. By increasing the frequency bandwidth of V1, the operating speed of the circuit 100 can be increased (e.g., to less than 10 ns). In some implementations, the capacitance of V2 may be small to increase the operating speed of the output stage 108.

In implementations, the circuit 100 is fully asynchronous. In some examples, the circuit 100 functions without a reference current. For example, the circuit 100 can reduce power consumption by reducing current flow in the circuit 100. The circuit 100 can have a small area due to its low power consumption.

Each of the transistors in the circuit 100 can be implemented using one or more than one electronic component. In some examples, N1 can be implemented using a network of transistors. In implementations, N1 can be constructed to include more than one NMOS transistors. For example, the NMOS transistor can be connected in parallel. Each of the NMOS transistors can be enabled or disabled by, for example, a memory controller. For example, the memory control can enable a portion of the NMOS transistors to adjust some characteristics of N2 (e.g., size, resistant, etc.).

A number of implementations of the invention have been described. Nevertheless, it will be understood that various modifications may be made without departing from the spirit and scope of the invention. Accordingly, other implementations are within the scope of the following claims.

The invention claimed is:

1. A circuit comprising:
a bias circuit connected to a bitline node;
a transimpedance amplifier connected to the bitline node and operable to generate a first voltage based on a current at the bitline node; and
a feedback circuit comprising a transistor having a first terminal coupled to a supply node, a second terminal coupled to the bitline node, and a gate responsive to the first voltage to generate a current between the first and second terminals.

2. The circuit of claim 1, wherein the bit line node is connected to a memory cell.

3. The circuit of claim 1, further comprising an output stage connected to the transimpedance amplifier and operable to amplify the first voltage to generate a second voltage.

4. The circuit of claim 3, wherein the output stage comprises an inverter operable to accept the second voltage as input and provide a voltage corresponding to a logic one or a logic zero.

5. The circuit of claim 1, wherein the bias circuit comprises a p-type transistor connected to the bitline node.

6. The circuit of claim 5, wherein a drain of the p-type transistor of the bias circuit is connected to the bitline node.

7. The circuit of claim 1, wherein the transimpedance amplifier includes a transistor connected to a transistor of the bias circuit in a current mirror arrangement.

8. A circuit comprising:
a bias circuit connected to a bitline node;
a transimpedance amplifier connected to the bitline node and operable to convert a current at the bitline node into a first voltage;
a feedback circuit connected to the transimpedance amplifier and operable to convert the first voltage into a feedback current to compensate for variation in the current at the bitline node; and
an output stage connected to the transimpedance amplifier and operable to amplify the first voltage to generate a second voltage, the output stage comprising an inverter operable to accept the second voltage as input and provide a voltage corresponding to a logic one or a logic zero, wherein a current trip point $Icell_{th}$ of the circuit is given by:

$$Icell_{th} = \frac{1}{n} \cdot K_P \left|\frac{W}{L}\right|_{N2} \cdot (VDD - Vt_{N2}) \cdot V_{th,INV}$$

where n is a sizing ratio between a p-type transistor of the feedback circuit that is used to convert the first voltage into the feedback current and a p-type transistor of the output stage that is connected to the p-type transistor of the feedback circuit, VDD is a supply voltage, $K_p$ is a p-type transistor manufacturing process gain factor, W is a width of an n-type transistor of the output stage that is connected to the p-type transistor of the output stage, L is a width of the n-type transistor of the output stage, $Vt_{N2}$ is a voltage threshold of the n-type transistor of the output stage, and $V_{th,INV}$ is a threshold voltage of the inverter.

9. A circuit comprising:
a bias circuit connected to a bitline node;
a transimpedance amplifier connected to the bitline node and operable to convert a current at the bitline node into a first voltage; and
a feedback circuit connected to the transimpedance amplifier and operable to convert the first voltage into a feedback current to compensate for variation in the current at the bitline node, wherein a voltage at the bitline node, $V_{bitline}$, is given by:

$$V_{bitline} = \sqrt{\frac{2 \cdot Ibias}{K_P \cdot \left|\frac{W}{L}\right|_{P1}}} + Vb2 + |Vt_{P1}|$$

where Ibias is a bias current generated by the bias circuit, Vb2 is a bias voltage generated by the bias circuit, $K_p$ is a p-type transistor manufacturing process gain factor, W is a width of a p-type transistor of the transimpedance amplifier, L is a width of the p-type transistor of the transimpedance amplifier, and $Vt_{P1}$ is a voltage threshold of the p-type transistor of the transimpedance amplifier.

10. A circuit comprising:
a bias circuit comprising a p-type transistor having a drain connected to a bitline node;
a transimpedance amplifier connected to the bitline node and operable to convert a current at the bitline node into a first voltage; and
a feedback circuit connected to the transimpedance amplifier and operable to convert the first voltage into a feedback current to compensate for variation in the current at the bitline node, wherein the bias circuit is operable to supply a bias voltage to a gate of the p-type transistor of the bias circuit; and
a relationship between a voltage at the bitline node, $V_{bitline}$, and a third bias voltage is given by:

$$V_{bitline} \leq Vb3 + |Vt_{Pb3}|$$

where Vb3 is the bias voltage supplied to the gate of the p-type transistor of the bias circuit and $Vt_{Pb3}$ is a threshold voltage of the p-type transistor of the bias circuit.

11. The circuit of claim 10, wherein:

$$Vb3 = VDD - \sqrt{\frac{2 \cdot Ibias}{K_p \cdot \left|\frac{W}{L}\right|_{P1}}} + |Vt_{P1}|$$

where VDD is a supply voltage, Ibias is a bias current generated by the bias circuit, $K_p$ is a p-type transistor manufacturing process gain factor, W is a width of the p-type transistor of the transimpedance amplifier, L is a width of the p-type transistor of the transimpedance amplifier, and $Vt_{P1}$ is a voltage threshold of the p-type transistor of the transimpedance amplifier.

12. A circuit comprising:
a bias circuit connected to a bitline node;
a transimpedance amplifier connected to the bitline node and operable to convert a current at the bitline node into a first voltage; and
a feedback circuit connected to the transimpedance amplifier and operable to convert the first voltage into a feedback current to compensate for variation in the current at the bitline node, wherein the bias circuit is operable to generate a bias current at an additional node and first, second, and third bias voltages.

13. The circuit of claim 12, wherein:
the first bias voltage is supplied to a gate of an n-type transistor of the transimpedance amplifier;
the second bias voltage is supplied to a gate of a p-type transistor of the transimpedance amplifier; and
the third bias voltage is supplied to a gate of a p-type transistor of the bias circuit.

14. The circuit of claim 13, wherein the drain of the p-type transistor of the bias circuit is connected to the bitline node.

15. The circuit of claim 14, wherein a voltage at the bitline node, $V_{bitline}$, is given by:

$$V_{bitline} = \sqrt{\frac{2 \cdot Ibias}{K_p \cdot \left|\frac{W}{L}\right|_{P1}}} + Vb2 + |Vt_{P1}|$$

where Ibias is the bias current generated by the bias circuit, Vb2 is the second bias voltage generated by the bias circuit, $K_p$ is a p-type transistor manufacturing process gain factor, W is a width of the p-type transistor of the transimpedance amplifier, L is a width of the p-type transistor of the transimpedance amplifier, and $Vt_{P1}$ is a voltage threshold of the p-type transistor of the transimpedance amplifier.

16. The circuit of claim 14, wherein:
the bias circuit supplies the third bias voltage to the gate of the p-type transistor of the bias circuit; and
a relationship between a voltage at the bitline node, $V_{bitline}$, and the third bias voltage is given by:

$$V_{bitline} \leq Vb3 + |Vt_{Pb3}|$$

where Vb3 is the third bias voltage and $Vt_{Pb3}$ is a threshold voltage of the p-type transistor of the bias circuit.

17. The circuit of claim 16, wherein:

$$Vb3 = VDD - \sqrt{\frac{2 \cdot Ibias}{K_p \cdot \left|\frac{W}{L}\right|_{P1}}} + |Vt_{P1}|$$

where VDD is a supply voltage, Ibias is the bias current generated by the bias circuit, $K_p$ is a p-type transistor manufacturing process gain factor, W is a width of the p-type transistor of the transimpedance amplifier, L is a width of the p-type transistor of the transimpedance amplifier, and $Vt_{P1}$ is a voltage threshold of the p-type transistor of the transimpedance amplifier.

18. The circuit of claim 14, wherein a current trip point $Icell_{th}$ of the circuit is given by:

$$Icell_{th} = \frac{1}{n} \cdot K_p \cdot \left|\frac{W}{L}\right|_{N2} \cdot (VDD - Vt_{N2}) \cdot V_{th,INV}$$

where n is a sizing ratio between a p-type transistor of the feedback circuit and a p-type transistor of the output stage, VDD is a supply voltage, $K_p$ is a p type transistor manufacturing process gain factor, W is a width of the n-type transistor of the output stage, L is a width of the n-type transistor of the output stage, $Vt_{N2}$ is a voltage threshold of the n-type transistor of the output stage, and $V_{th,INV}$ is a threshold voltage of the inverter.

19. A circuit comprising:
a bias circuit connected to a bitline node;
a transimpedance amplifier connected to the bitline node and operable to convert a current at the bitline node into a first voltage; and
a feedback circuit operable to convert the first voltage into a feedback current to compensate for variation in the current at the bitline node wherein the transimpedance amplifier comprises a p-type transistor and an n-type transistor, the n-type transistor having:
  a source connected to a ground;
  a gate connected to a first bias voltage of the bias circuit; and
  a drain connected to a first output node, the p-type transistor having:
  a source connected to the bitline node;
  a gate connected to a second bias voltage of the bias circuit; and
  a drain connected to the first output node.

20. The circuit of claim 19, wherein the feedback circuit comprises a p-type transistor having:
  a source connected to a voltage supply;
  a gate connected to the first output node; and
  a drain connected to the bitline node.

21. A circuit comprising:
  a bias circuit connected to a bitline node;
  a transimpedance amplifier connected to the bitline node and operable to convert a current at the bitline node into a first voltage; and
  a feedback circuit connected to the transimpedance amplifier and operable to convert the first voltage into a feedback current to compensate for variation in the current at the bitline node, wherein the output stage comprises a p-type transistor and an n-type transistor, and an inverter, the p-type transistor having:
  a source connected to a voltage supply;
  a gate connected to a first output node; and
  a drain connected to a second output node, the n-type transistor having:
  a source connected to a ground;
  a gate connected to the voltage source; and
  a drain connected to the second output node, the inverter having:
  an input connected to the second output node; and
  an inverter output providing an output of the circuit.

22. A circuit comprising:
  a line used to sense current from a memory cell;
  a bias circuit comprising a first transistor having a gate responsive to a first voltage generated by the bias circuit, a first terminal connected to a first supply node, and a second terminal connected to the line;
  a second transistor and a third transistor connected in series between the line and a second supply node;
  a fourth transistor having a gate responsive to a second voltage at a node between the second and third transistors, a first terminal of the fourth transistor connected to the first supply node, and a second terminal of the fourth transistor connected to the line; and
  an output stage connected the node between the second and third transistors and operable to generate an output voltage based on a state of the memory cell.

23. The circuit of claim 22, wherein the first and second transistors have a same transistor type.

24. The circuit of claim 23, wherein the third transistor has the same transistor type as the first and second transistors.

25. The circuit of claim 24, wherein the second and third transistors have different transistor types.

26. The circuit of claim 25, wherein the bias circuit further comprises a fifth transistor connected to the third transistor in a current mirror arrangement.

* * * * *

UNITED STATES PATENT AND TRADEMARK OFFICE
CERTIFICATE OF CORRECTION

| | | |
|---|---|---|
| PATENT NO. | : 7,642,815 B2 | Page 1 of 1 |
| APPLICATION NO. | : 11/855565 | |
| DATED | : January 5, 2010 | |
| INVENTOR(S) | : Jimmy Fort | |

It is certified that error appears in the above-identified patent and that said Letters Patent is hereby corrected as shown below:

On the title page, in Item (75), in "Inventor", delete "Provence (FR)" and insert -- Aix en Provence (FR) --, therefor.

In column 3, line 21, delete "Off" and insert -- off --, therefor.

In column 3, line 38, delete "$I_{p1,}$" and insert -- $I_{p1}$ --, therefor.

In column 3, line 40, delete "$I_{p1,}$ may" and insert -- $I_{p1}$ may --, therefor.

Signed and Sealed this

Thirtieth Day of March, 2010

David J. Kappos
*Director of the United States Patent and Trademark Office*